(12) United States Patent
Voss et al.

(10) Patent No.: US 9,082,741 B2
(45) Date of Patent: Jul. 14, 2015

(54) SEMICONDUCTOR DEVICE INCLUDING FIRST AND SECOND SEMICONDUCTOR MATERIALS

(75) Inventors: Stephan Voss, Munich (DE); Franz-Josef Niedernostheide, Münster (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 297 days.

(21) Appl. No.: 13/475,319

(22) Filed: May 18, 2012

(65) Prior Publication Data

US 2013/0307018 A1 Nov. 21, 2013

(51) Int. Cl.
| | |
|---|---|
| H01L 29/36 | (2006.01) |
| H01L 29/08 | (2006.01) |
| H01L 29/861 | (2006.01) |
| H01L 29/739 | (2006.01) |
| H01L 29/161 | (2006.01) |
| H01L 29/165 | (2006.01) |
| H01L 29/167 | (2006.01) |

(52) U.S. Cl.
CPC ............... *H01L 29/36* (2013.01); *H01L 29/08* (2013.01); *H01L 29/161* (2013.01); *H01L 29/165* (2013.01); *H01L 29/167* (2013.01); *H01L 29/7395* (2013.01); *H01L 29/861* (2013.01)

(58) Field of Classification Search
CPC ....... H01L 29/36; H01L 29/861; H01L 29/08; H01L 29/78; H01L 29/161; H01L 29/165; H01L 29/167; H01L 29/7395; H01L 29/06
USPC ........... 257/139, 192, 183, E29.255, E29.027
See application file for complete search history.

(56) References Cited

U.S. PATENT DOCUMENTS

| | | | |
|---|---|---|---|
| 5,894,141 A * | 4/1999 | Bhalla ........................... | 257/197 |
| 2004/0180485 A1* | 9/2004 | Beasom ........................ | 438/197 |

(Continued)

FOREIGN PATENT DOCUMENTS

DE 10357796 B4 9/2007

OTHER PUBLICATIONS

Voss et al. "Substitutional Zn in SiGe: Deep-level transient spectroscopy and electron density calculations" Phys. Rev. B 68, Published Jul. 16, 2003.*

(Continued)

*Primary Examiner* — Asok K Sarkar
*Assistant Examiner* — Dmitriy Yemelyanov
(74) *Attorney, Agent, or Firm* — Murphy, Bilak & Homiller, PLLC

(57) ABSTRACT

A semiconductor device includes a first semiconductor region including a first semiconductor material. The semiconductor device further includes a second semiconductor region adjoining the first semiconductor region. The second semiconductor region includes a second semiconductor material different from the first semiconductor material. The semiconductor device further includes a drift or base zone in the first semiconductor region. The semiconductor device further includes an emitter region in the second semiconductor region. The second semiconductor region includes at least one type of deep-level dopant. A solubility of the at least one type of deep-level dopant is higher in the second semiconductor region than in the first semiconductor region.

20 Claims, 3 Drawing Sheets

(56) References Cited

U.S. PATENT DOCUMENTS

2006/0289916 A1* 12/2006 Park et al. .................. 257/296
2007/0063222 A1* 3/2007 Shima ........................ 257/192
2010/0258840 A1* 10/2010 Schulze ...................... 257/139

OTHER PUBLICATIONS

Voss et al. ("Energy levels of Zn in Si 1–x Ge x alloys"; Applied Physics Letters vol. 73, No. 16; Oct. 19, 1998).*

Voss et al. ("Energy Levels of Zn in Si 1ÿxGex Alloys:The Change-Over from Highly Localized Deep States to Shallow-Level Centers" phys. stat. sol. (b) 210, 771 (1998).*

Zhang et al. ("Adjustable High-Speed Insulated Gate Bipolar Transistor" IEEE Transactions on Plasma Science, vol. 34, No. 3, Jun. 2006).*

Sandip Tiwari, et al. "Empirical fit to band discontinuities and barrier heights in III-V alloy systems." Applied Physics Letters, vol. 60, No. 5, Feb. 3, 2012. pp. 630-632. American Institute of Physics, New York.

S. Voss, et al. "Substitutional Zn in SiGe: Deep-level transient spectroscopy and electron density calculations." Physical Reveiw B, vol. 68, 035208. Jul. 16, 2003. pp. 1-9. The American Physical Society, United States of America.

J. Weber, et al. "Near-band-gap photoluminescence of Si-Ge alloys." Physical Review B, vol. 40, No. 8. Sep. 15, 1989. pp. 5683-5693.The American Physical Society, United States of America.

* cited by examiner

SEMICONDUCTOR DEVICE INCLUDING FIRST AND SECOND SEMICONDUCTOR MATERIALS

BACKGROUND

Characteristics of semiconductor devices typically depend upon temperature. As an example, efficiency of an emitter in a bipolar or parasitic bipolar device or a threshold voltage in a Field Effect Transistor (FET) device are typically temperature-dependent. It is desirable to improve a temperature dependency of characteristics of a semiconductor device.

SUMMARY

According to an embodiment of a semiconductor device, the semiconductor device includes a first semiconductor region including a first semiconductor material. The semiconductor device further includes a second semiconductor region adjoining the first semiconductor region. The second semiconductor region includes a second semiconductor material different from the first semiconductor material. The semiconductor device further includes a drift or base zone in the first semiconductor region. The semiconductor device further includes an emitter region in the second semiconductor region. The second semiconductor region includes at least one type of deep-level dopants. A solubility of the at least one type of deep-level dopants is higher in the second semiconductor region than in the first semiconductor region.

According to another embodiment of a semiconductor device, the semiconductor device includes a first semiconductor region including a first semiconductor material. The semiconductor device further includes a second semiconductor region adjoining the first semiconductor region. The second semiconductor region includes a second semiconductor material different from the first semiconductor material. The semiconductor device further includes a drift or base zone in the first semiconductor region. The semiconductor device further includes a body region in the second semiconductor region. The body region includes a channel region adjoining a gate control structure. The semiconductor device further includes a source region in the body region. The second semiconductor region includes at least one type of deep-level dopants. A solubility of the at least one type of deep-level dopants is higher in the second semiconductor region than in the first semiconductor region.

According to yet another embodiment of a semiconductor device, the semiconductor device includes a first semiconductor region including a first semiconductor material. The semiconductor device further includes a second semiconductor region adjoining the first semiconductor region. The second semiconductor region includes a second semiconductor material different from the first semiconductor material. The semiconductor device further includes a contact structure adjoining the second semiconductor region. The second semiconductor region includes at least one type of deep-level defect. A solubility of the at least one type of deep-level defect is higher in the second semiconductor region than in the first semiconductor region.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Figure 1:
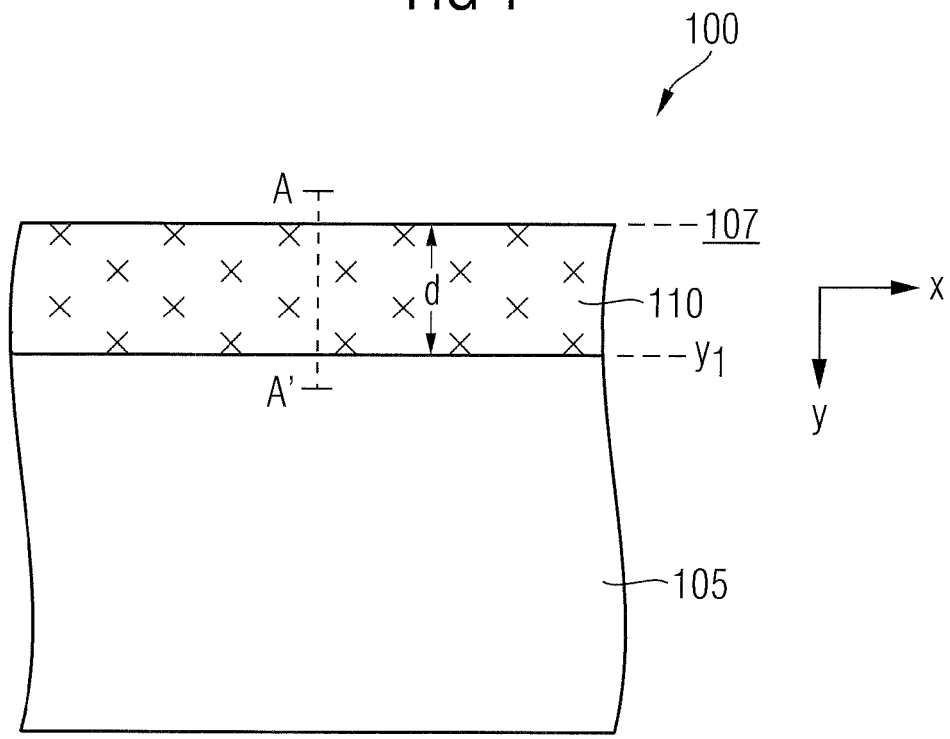
FIG. 1 schematically illustrates a cross-sectional view of a semiconductor device including a first semiconductor material and second semiconductor material including a deep-level dopants.

Embodiments are depicted in the drawings and are detailed in the description which follows.

DETAILED DESCRIPTION

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together—intervening elements may be provided between the "coupled" or "electrically coupled" elements.

Semiconductor devices including power semiconductor chips are described below. The power semiconductor chips may be of different types, may be manufactured by different technologies and may include, for example, integrated electrical, electro-optical or electromechanical circuits or passives. The power semiconductor chips may contain inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The power semiconductor chips may comprise power MOSFETs (Metal Oxide Semiconductor Field Effect Transistors), DMOSFETs (Double-diffused MOSFET), IGBTs (Insulated Gate Bipolar Transistors), JFETs (Junction Gate Field Effect Transistors), power bipolar transistors, thyristors or power diodes such as power Schottky diodes. A power semiconductor chip having a vertical structure, i.e. vertical power semiconductor chip, may have terminals such as contacts on its two main faces, that is to say on its top side and bottom side, or, in other words, on its front side and rear side. By way of example, the source electrode and the gate electrode of a power MOSFET may be situated on one main face, while the drain electrode of the power MOSFET may be arranged on the other main face. The contacts may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

FIG. 1 schematically illustrates a cross-sectional view of a semiconductor device 100 including a first semiconductor region 105 and a second semiconductor region 110 adjoining the first semiconductor region 110. As an example, the second semiconductor region 110 may be formed on the first semiconductor region 105 by epitaxy. The first semiconductor region 105 includes or is formed of a first semiconductor material. The second semiconductor region 110 includes or is formed of a second semiconductor material that is different from the first semiconductor material. The second semiconductor region 110 includes at least one type of deep-level dopant, e.g. a deep-level acceptor or a deep-level donor. A solubility of the at least one type of deep-level dopant is higher in the second semiconductor region 110 than in the first semiconductor region 105. The term "deep-level dopant" is used herein in the sense that the energy required to remove an electron or hole from the dopant to the valence or conduction band is much larger than the characteristic thermal energy kT, where k is the Boltzmann constant and T is temperature. As an example, a distance between a deep-level dopant in $Si_{1-X}Ge_X$ or Si to the valence or conduction band may be at least 100 meV. A defect having a distance smaller than 100 meV and preferably more than 200 meV to the valence or conduction band is called a shallow defect. Examples for shallow defects in silicon are B and Ga as acceptors and P and As as donors.

An emitter region is formed in the second semiconductor region 110. As an example, the emitter region may be entirely formed of the second semiconductor material. As a further example, one part, e.g. a main part, of the emitter region may be formed of the second semiconductor material and another part may be formed of the first semiconductor material. In other words, the emitter region may extend from the second semiconductor region 110 into the first semiconductor region 105.

A drift or base zone of the semiconductor device 100 is formed in the first semiconductor region 105. As an example, the drift or base zone may be entirely formed of the first semiconductor material. As a further example, one part, e.g. a main part or at least 70% of the drift or base zone may be formed of the first semiconductor material and another part may be formed of the second semiconductor material. In other words, the drift or base zone may extend from the first semiconductor region 105 into the second semiconductor region 110.

According to an embodiment, the first semiconductor material is Si and the second semiconductor material is $Si_{1-X}Ge_X$. The element Zn is one example of a deep-level dopant having a solubility in the second semiconductor region 110 that is higher than in the first semiconductor region 105. As a further example, deep-level dopants may also be formed by irradiating the second semiconductor region 110, thereby forming deep-level dopants, e.g. vacancies. The element Zn forms a deep-level double acceptor in $Si_{1-X}Ge_X$, for example. According to an embodiment, a content X of Ge in the second semiconductor material decreases in a direction from the emitter region at a first side 107 to the drift or base zone. The content X may decrease from between 0.2 and 0.8 to 0. A thickness d of the second semiconductor region 110 may be between 50 nm and 20 μm and preferably between 100 nm and 2 μm.

According to an embodiment, the semiconductor device 100 is a diode, e.g. a power diode. The deep-level dopants may be arranged in an anode emitter region or a cathode emitter region of the diode. According to another embodiment, the semiconductor device 100 is an Insulated Gate Bipolar Transistor (IGBT) and the deep-level dopants may be arranged in an emitter region at a collector side. According to yet another embodiment, the deep-level dopants may be formed in a body region of an FET.

The deep-level dopants are hardly or only partly ionized at a moderate temperature level, e.g. room temperature T=300 K, whereas shallow-level defects are completely or predominantly ionized at the moderate temperature level. When increasing the temperature, the deep-level dopants may contribute to doping of the emitter region since they only have been hardly or partly ionized at the moderate temperature level. Thus, the emitter efficiency of the semiconductor device 100 increases with increasing temperature. In a bipolar power device, e.g. a diode or an IGBT, power losses tend to increase in case of surge currents. For this reason also a temperature within the bipolar power device increases, thereby increasing the likelihood of device destruction. Increasing the emitter efficiency of the semiconductor device 100 with increasing temperature allows to counteract device destruction by decreasing the temperature-dependency of on-state power losses, thereby increasing the surge current ruggedness.

Figure 2:
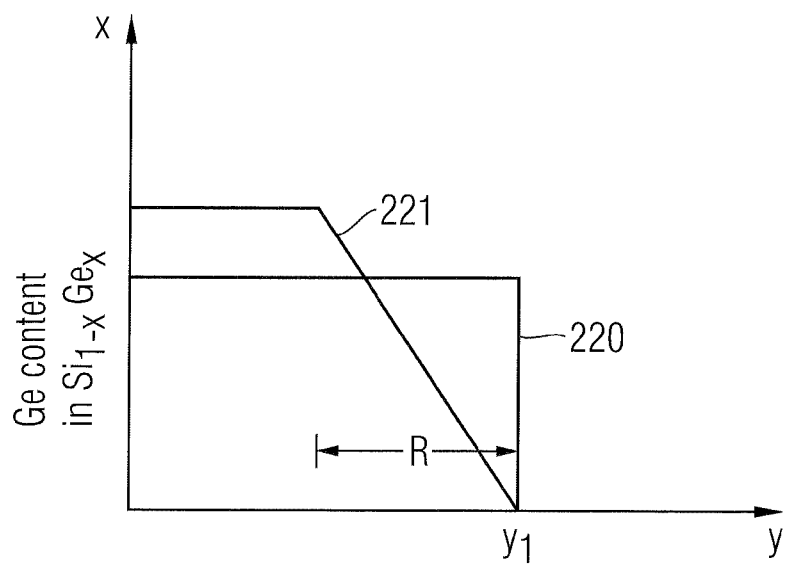
FIG. 2 illustrates one specific example of a profile of a Ge content X in $Si_{1-X}Ge_X$ being one example of the second semiconductor material illustrated in FIG. 1 as a cross section along a line A-A'.

FIG. 2 illustrates a schematic diagram of a profile of Ge content X of $Si_{1-X}Ge_X$ constituting one specific example of the second semiconductor material of the semiconductor device 100 illustrated in FIG. 1. The Ge content x is illustrated versus the y-axis, i.e. versus a vertical direction perpendicular to a first side. According to one embodiment illustrated as curve 220, the content X of Ge in $Si_{1-X}Ge_X$ is constant. The constant level may be in a range of 0.2 to 0.8, or in a range of 0.4 to 0.6. According to another embodiment illustrated as curve 221, the content X of Ge in $Si_{1-X}Ge_X$ decreases in a transition region R from a constant level in a range of 0.2 to 0.8, or in a range of 0.4 to 0.6 in the direction y, i.e. the vertical direction, to a value 0. The gradual decrease of the Ge content X in the region R may be beneficial as regards stress-related impacts on device behavior. As an example, the gradual decrease of the Ge content X may be beneficial in case a pn junction extends over an interface between the first and second semiconductor materials.

Figure 3:
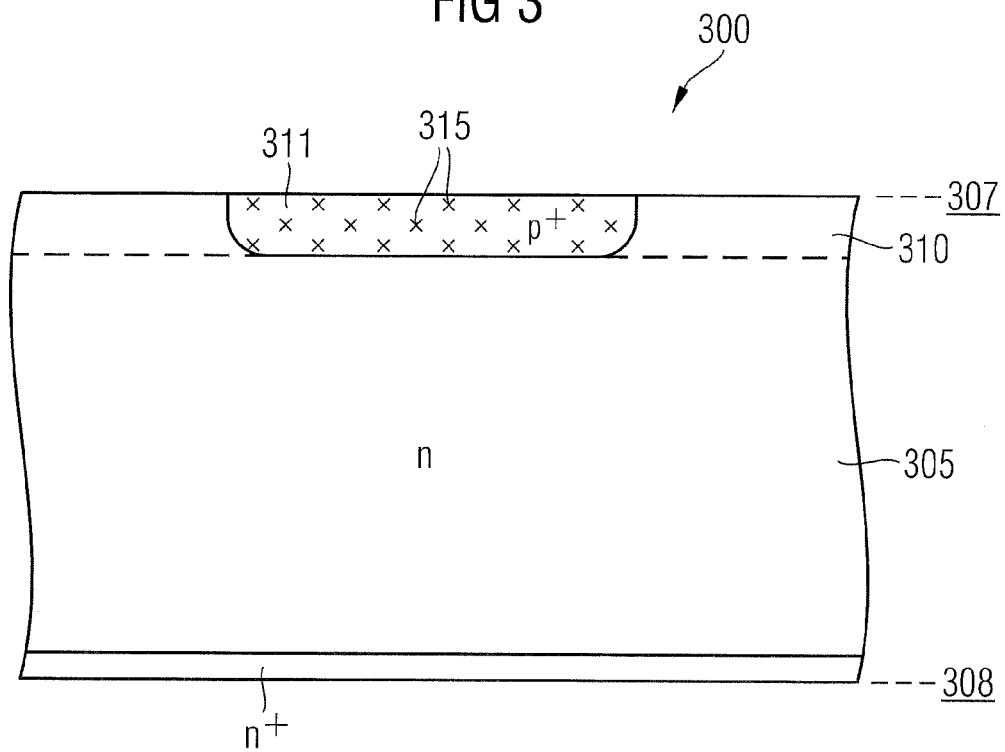
FIG. 3 schematically illustrates a cross-sectional view of a semiconductor power diode including a first semiconductor material and a second semiconductor material including a deep-level dopant.

FIG. 3 illustrates a schematic cross-sectional view of a semiconductor power diode 300 including a first semiconductor region 305 and a second semiconductor region 310 adjoining the first semiconductor region 305. The first semiconductor region 305 includes or is formed of an n-doped first semiconductor material, e.g. Si and constitutes an n-doped drift or base zone. An $n^+$-type cathode contact zone is formed at a second side 308, e.g. a rear side or cathode side of the power diode 300. The first semiconductor region 305 may be a semiconductor substrate, e.g. a silicon substrate and may include one or a plurality of semiconductor layers thereon.

The second semiconductor region 310 includes or is formed of a second semiconductor material that is different from the first semiconductor material, e.g. $Si_{1-X}Ge_X$. The second semiconductor region 310 includes deep-level acceptors in an anode emitter region 311 formed in the second semiconductor region 310 at a first side 307, e.g. a front side or anode side. The deep level acceptors are illustrated in a simplified manner as crosses x denoted by reference numeral 315. A solubility of the deep-level acceptors 315 is higher in the second semiconductor region 310 than in the first semiconductor region 305. According to an embodiment, the deep level acceptors correspond to Zn or include Zn.

In the embodiment illustrated in FIG. 3, a bottom side of the emitter region 311 coincides with an interface between the first semiconductor region 305 and the second semiconductor region 310. According to another embodiment, the interface between the first semiconductor region 305 and the second semiconductor region 310 may be arranged above or below the bottom side of the anode emitter region 311. Apart from the deep-level acceptors in the anode emitter region 311, also shallow acceptors may be present, e.g. B. According to an embodiment, a concentration of the deep-level acceptors in at least part of the emitter region 311 exceeds $5 \times 10^{17}$ cm$^{-3}$. A maximum concentration of the deep-level acceptors in the anode emitter region 311 may exceed any concentration of shallow acceptors so as to determine the emitter efficiency at higher temperatures.

The deep-level acceptors 315 are typically hardly or only partly ionized at a moderate temperature level, e.g. room temperature T=300 K, whereas shallow-level defects that may be present in the anode emitter region 311 are completely or predominantly ionized at the moderate temperature level. When increasing the temperature, the deep-level acceptors 315 may contribute to doping of the anode emitter region 311 since they only have been hardly or partly ionized at the moderate temperature level. Thus, the efficiency of the anode emitter region 311 increases with increasing temperature, counteracting the likelihood of device destruction by decreasing the temperature-dependency of on-state power losses.

According to one example, the second semiconductor material includes or is made of $Si_{1-X}Ge_X$. A content X of Ge may have a constant level. The constant level may be in a range of 0.2 to 0.8, or in a range of 0.4 to 0.6. According to another example, the content X of Ge in $Si_{1-X}Ge_X$ may decrease from a constant level in a range of 0.2 to 0.8, or in a range of 0.4 to 0.6 at the first side 307 to a value 0 at an interface between the first semiconductor material and the second semiconductor material. The gradual decrease of the Ge content x may be beneficial as regards stress-related impacts on device behavior. As an example, the gradual decrease of the Ge content x may be beneficial in case a pn junction extends over an interface between the first and second semiconductor materials.

Figure 4:
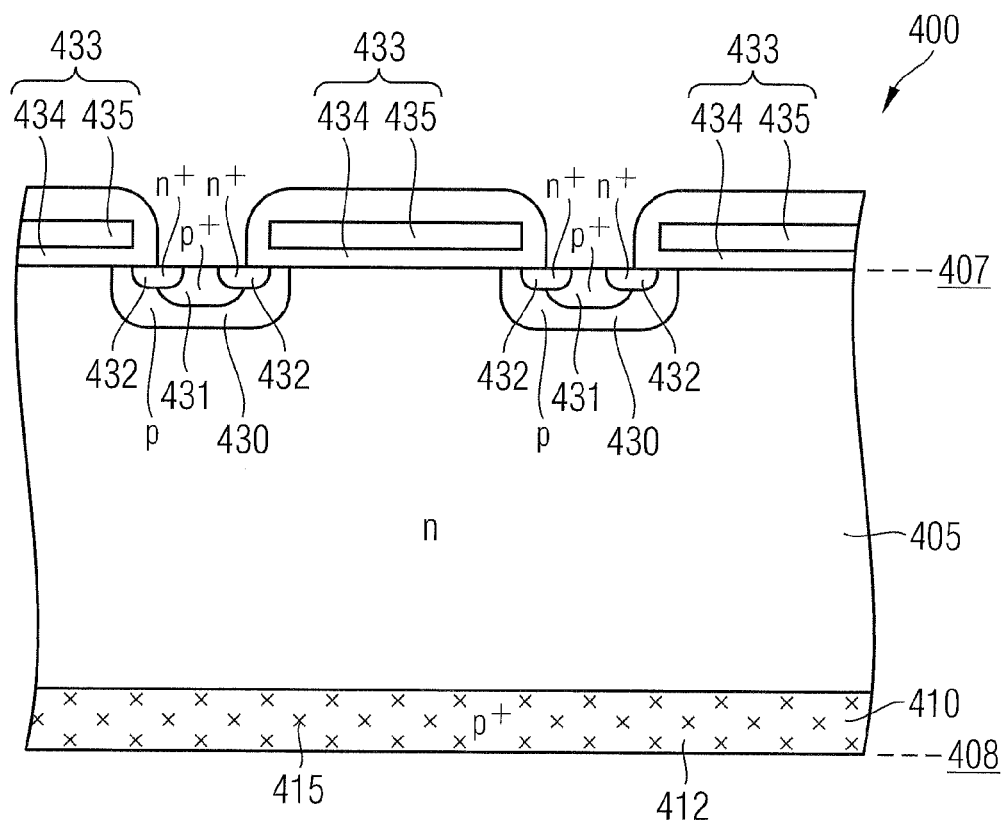
FIG. 4 schematically illustrates a cross-sectional view of an Insulated Gate Bipolar Transistor (IGBT) including a first semiconductor material and a second semiconductor material including a deep-level impurity.

FIG. 4 illustrates a schematic cross-sectional view of an IGBT 400 including a first semiconductor region 405 and a second semiconductor region 410 adjoining the first semiconductor region 405. The first semiconductor region 405 includes or is formed of an n-doped first semiconductor material, e.g. Si and constitutes an n-doped drift or base zone. One example of an IGBT cell design at a first side 407, e.g. a front side or IGBT emitter side includes p-type body regions 430, $p^+$-type contact regions 431, source regions 432, and gate structures 433 including gate electrodes 435 and gate dielectrics 434. Apart from the IGBT cell design illustrated at the first side 407 of FIG. 4, other cell designs, e.g. trench cell designs, may likewise be applied.

The second semiconductor region 410 includes or is formed of a second semiconductor material that is different from the first semiconductor material, e.g. $Si_{1-X}Ge_X$. The second semiconductor region 410 includes deep-level acceptors in an $p^+$-type emitter region 412 formed in the second semiconductor region 410 at a second side 408, e.g. a rear side or an IGBT collector side. The deep level acceptors are illustrated in a simplified manner as crosses x denoted by reference numeral 415. A solubility of the deep-level acceptors 415 is higher in the second semiconductor region 410 than in the first semiconductor region 405. According to an embodiment, the deep level acceptors correspond to Zn or include Zn. In addition to the deep-level acceptors 415, further acceptors, e.g. shallow level acceptors may be formed in the second semiconductor region 410. According to an embodiment, a concentration of the deep-level acceptors 415 in at least part of the $p^+$-type emitter region 412 exceeds $5 \times 10^{17}$ cm$^{-3}$, $5 \times 10^{17}$ cm$^{-3}$ or $2 \times 10^{18}$ cm$^{-3}$. A maximum concentration of the deep-level acceptors 415 in the $p^+$-type emitter region 412 may exceed any concentration of shallow acceptors so as to determine the emitter efficiency at higher temperatures.

In the embodiment illustrated in FIG. 4, a top side of the $p^+$-type emitter region 412 coincides with an interface between the first semiconductor region 405 and the second semiconductor region 410. According to another embodiment, the interface between the first semiconductor region 405 and the second semiconductor region 410 may be arranged above or below the bottom side of the $p^+$-type emitter region 412.

The deep-level acceptors 415 are typically hardly or only partly ionized at a moderate temperature level, e.g. room temperature T=300 K, whereas shallow-level defects that may be present in the $p^+$-type emitter region 412 are completely or predominantly ionized at the moderate temperature level. When increasing the temperature, the deep-level acceptors 415 may contribute to doping of the $p^+$-type emitter region 412 since they only have been hardly or partly ionized at the moderate temperature level. Thus, the efficiency of the $p^+$-type emitter region 412 increases with increasing temperature, counteracting the likelihood of device destruction by decreasing the temperature-dependency of on-state power losses.

According to one example, the second semiconductor material includes or is made of $Si_{1-X}Ge_X$. A content X of Ge may have a constant level. The constant level may be in a range of 0.2 to 0.8, or in a range of 0.4 to 0.6. According to another example, the content X of Ge in $Si_{1-X}Ge_X$ may decrease from a constant level in a range of 0.2 to 0.8, or in a range of 0.4 to 0.6 at the second side 408 to a value 0 at an interface between the first semiconductor material and the second semiconductor material. The gradual decrease of the Ge content X may be beneficial as regards stress-related impacts on device behavior. As an example, the gradual decrease of the Ge content X may be beneficial in case a pn junction extends over an interface between the first and second semiconductor materials.

Figure 5:
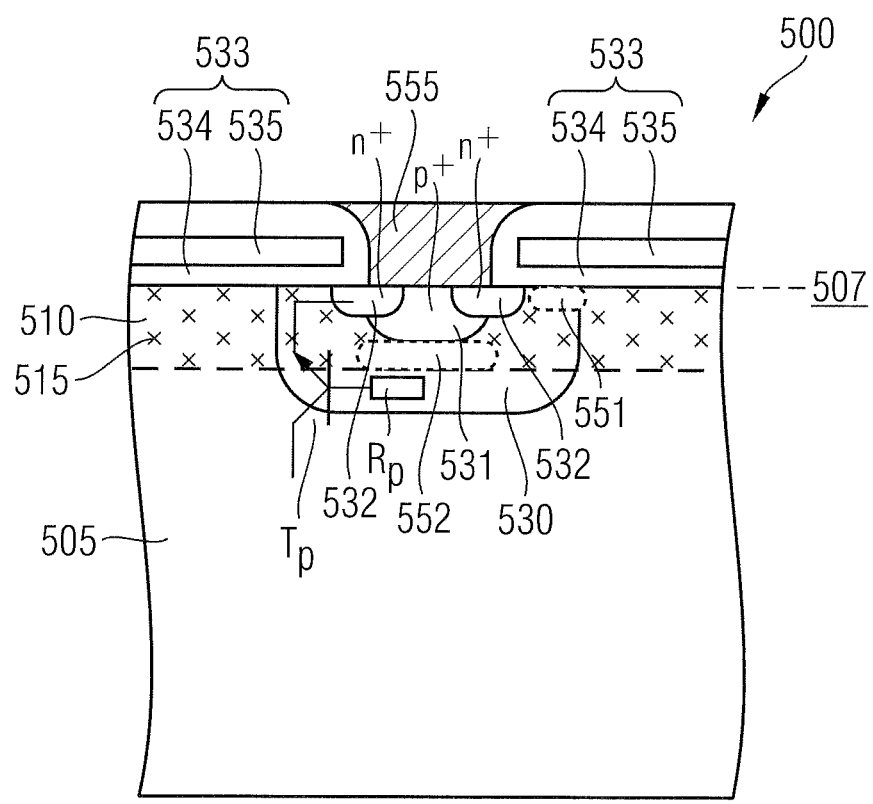
FIG. 5 schematically illustrates a cross-sectional view of an FET including a first semiconductor material and second semiconductor material including a deep-level impurity.

FIG. 5 illustrates a schematic cross-sectional view of an FET 500 including a first semiconductor region 505 and a second semiconductor region 510 adjoining the first semiconductor region 505. The first semiconductor region 505 includes or is formed of an n-doped first semiconductor material, e.g. Si and constitutes an n-doped drift or base zone. One example of an FET cell design at a first side 507, e.g. a front side includes a p-type body region 530, a p$^+$-type contact region 531, source regions 532, and a gate structure 533 including a gate electrode 535 and a gate dielectric 534. Apart from the FET cell design illustrated at the first side 507 of FIG. 5, other cell designs, e.g. trench cell designs may likewise be applied. The FET 500 may be a lateral FET, i.e. including contact to source and drain at the first side 507, or a vertical FET including contacts to source and drain at opposite sides. A cell area of the FET 500 may include a plurality of cells as illustrated in FIG. 5. These cells may be arranged according to different cell geometries, e.g. stripes, rectangular or honeycomb pattern.

The second semiconductor region 510 includes or is formed of a second semiconductor material that is different from the first semiconductor material, e.g. $Si_{1-X}Ge_X$. The second semiconductor region 510 includes deep-level acceptors in an area of the p-type body region 530. In particular, the deep-level acceptors are formed in a channel region 551 of the FET 500 adjoining the gate dielectric 534. The deep-level acceptors may also be formed in a region 552 of the p-type body region 530 below the p$^+$-type contact region 531 and the source regions 532. The deep level acceptors are illustrated in a simplified manner as crosses x denoted by reference numeral 515. A solubility of the deep-level acceptors 515 is higher in the second semiconductor region 510 than in the first semiconductor region 505. According to an embodiment, the deep-level acceptors 515 correspond to Zn or include Zn. In addition to the deep-level acceptors 515 further acceptors, e.g. shallow level acceptors, may be formed in the second semiconductor region 510. According to an embodiment, a concentration of the deep-level acceptors 515 in at least part of the p$^+$-type emitter region 512 exceeds $1 \times 10^{17}$ cm$^{-3}$, $3 \times 10^{17}$ cm$^{-3}$ or $1 \times 10^{18}$ cm$^{-3}$. A maximum concentration of the deep-level acceptors 515 in the p-type body region 530 may exceed any concentration of shallow acceptors so as to determine a body sheet resistance at higher temperatures.

The deep-level acceptors 515 are typically hardly or only partly ionized at a moderate temperature level, e.g. room temperature T=300 K, whereas shallow-level defects that may be present in the p-type body region 530 are completely or predominantly ionized at the moderate temperature level. When increasing the temperature, the deep-level acceptors 515 may contribute to doping of the p-type body region 530 since they only have been hardly or partly ionized at the moderate temperature level. This contributes to a decrease of the sheet resistance of the p-type body region 530 with increasing temperature, and thus to a decrease of a base resistor $R_p$ biasing a parasitic bipolar transistor $T_p$. Hence, turn-on of the parasitic bipolar $T_p$ is counteracted or hindered leading to an improvement of the latch-up behavior of the FET 500. Likewise, the threshold voltage $V_{th}$ in the channel region 551 may increase stronger with increasing temperature compared to p-body doping with shallow acceptors due to the increase of the p-body doping with increasing temperature caused by the doping with deep level dopants. Such a behavior can reduce current filamentation in local hot areas of the device. Further, the contribution of the deep-level acceptors 515 to doping of the p$^+$-type body contact region 531 may improve a contact resistance to a contact structure 555, e.g. a conductive structure including metal and/or highly doped semiconductor material, that is electrically coupled to the p$^+$-type body contact region 531.

In the embodiment illustrated in FIG. 5, a bottom side of the p-type body region 530 is arranged above an interface between the first semiconductor region 505 and the second semiconductor region 510. According to another embodiment, the interface between the first semiconductor region 505 and the second semiconductor region 510 may be arranged below or coincide with the bottom side of the p-type body region 530.

The information given with regard to the embodiment illustrated in FIG. 1 applies accordingly to the other embodiments.

According to another embodiment, the second semiconductor region including at least one type of deep-level dopant, e.g. a deep-level acceptor or a deep-level donor, is part or corresponds to a field stop zone of a semiconductor device, e.g. an FET or IGBT or a compensation zone, e.g. a doped column of a superjunction device. A solubility of the at least one type of deep-level dopant is higher in the second semiconductor region than in the first semiconductor region, which may include or correspond to a drift zone. As an example, the second semiconductor region may include $Si_{1-X}Ge_X$ and Zn as the deep level dopant. Thereby, a p-doped field stop zone may be formed. The field stop zone including a deep-level dopant allows improving adjustment of temperature-dependency of characteristics, e.g. a softness during turn-off, a leakage current or a short-circuit current capability.

Spatially relative terms such as "under", "below", "lower", "over", "upper", "above" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
  a first semiconductor region including a first semiconductor material;
  a second semiconductor region adjoining the first semiconductor region, wherein the second semiconductor region includes a second semiconductor material different from the first semiconductor material;

a drift or base zone in the first semiconductor region; and further comprising at least one type of deep-level dopant in an emitter region of the second semiconductor region, the at least one type of deep-level dopant having a distance to the valence or conduction band of at least 100 meV and having a higher solubility in the emitter than in the drift or base zone.

2. The semiconductor device of claim 1, wherein the first semiconductor material is Si and the second semiconductor material is $Si_{1-x}Ge_x$.

3. The semiconductor device of claim 2, wherein the at least one type of deep-level dopant includes Zn.

4. The semiconductor device of claim 2, wherein the content of Ge in the second semiconductor material decreases in a direction from the emitter region to the drift or base zone.

5. The semiconductor device of claim 4, wherein the content of Ge in the second semiconductor material decreases from between 0.2 and 0.8 to 0.

6. The semiconductor device of claim 2, wherein the content of Ge in the second semiconductor material is in a range between 0.2 and 0.8.

7. The semiconductor device of claim 2, wherein a thickness of the second semiconductor region is between 50 nm and 20 μm.

8. The semiconductor device of claim 1, wherein at least 70% of the drift or base zone is formed in the first semiconductor region.

9. The semiconductor device of claim 1, wherein the drift or base zone is entirely formed in the first semiconductor region.

10. The semiconductor device of claim 1, wherein a first part of the emitter region is formed in the second semiconductor region and a second part of the emitter region is formed in the first semiconductor region.

11. The semiconductor device of claim 10, wherein a maximum concentration of the at least one type of deep-level dopant in the first part of the emitter region is higher than a maximum concentration of any type of impurity in the second part of the emitter region.

12. The semiconductor device of claim 1, wherein the semiconductor device is one of a diode, a thyristor and an IGBT and the emitter region is arranged at one of an anode or cathode side of the diode and a collector side of the IGBT.

13. The semiconductor device of claim 1, wherein a concentration of the at least one type of deep-level dopant in at least a part of the second semiconductor region exceeds $10^{17}$ $cm^{-3}$.

14. The semiconductor device of claim 1, wherein the second semiconductor region is an epitaxial layer on the first semiconductor region.

15. A field effect transistor comprising:
a first semiconductor region including a first semiconductor material;
a second semiconductor region adjoining the first semiconductor region, wherein the second semiconductor region includes a second semiconductor material different from the first semiconductor material;
a drift zone in the first semiconductor region;
a shallow-level and at least one type of deep-level dopant in a body region arranged in the second semiconductor region, wherein the body region includes a channel region adjoining a gate control structure, the at least one type of deep-level dopant having a distance to the valence or conduction band of at least 100 meV and having a higher solubility in the second semiconductor region than in the drift zone; and
a source region in the body region.

16. The semiconductor device of claim 15, wherein a part of the second semiconductor region is arranged between a bottom side of the source region and an interface between the first semiconductor material and the second semiconductor material.

17. The semiconductor device of claim 15, wherein a part of the second semiconductor region adjoins the gate control structure.

18. The semiconductor device of claim 15, wherein the first semiconductor material is Si and the second semiconductor material is $Si_{1-x}Ge_x$.

19. The semiconductor device of claim 15, wherein the at least one type of deep-level dopants includes Zn.

20. The semiconductor device of claim 15, wherein a concentration of the at least one type of deep-level dopants in at least a part of the second semiconductor region exceeds $10^{17}$ $cm^{-3}$.

* * * * *

UNITED STATES PATENT AND TRADEMARK OFFICE
CERTIFICATE OF CORRECTION

| | | |
|---|---|---|
| PATENT NO. | : 9,082,741 B2 | Page 1 of 1 |
| APPLICATION NO. | : 13/475319 | |
| DATED | : July 14, 2015 | |
| INVENTOR(S) | : S. Voss et al. | |

It is certified that error appears in the above-identified patent and that said Letters Patent is hereby corrected as shown below:

On The Title Page, Item (56)/Other Publications, page 2, column 1, line 3, please change "1ÿx" to
-- 1 x --
On The Title Page, Item (56)/Other Publications, page 2, column 1, line 3, please change "Alloys:The" to -- Alloys: The --
On The Title Page, Item (56)/Other Publications, page 2, column 2, line 9, please change "Reveiw B" to -- Review B --

Signed and Sealed this
Ninth Day of February, 2016

Michelle K. Lee
*Director of the United States Patent and Trademark Office*